(12) United States Patent
Takahashi et al.

(10) Patent No.: US 11,435,385 B2
(45) Date of Patent: Sep. 6, 2022

(54) SPECIFIC CONDUCTIVITY MEASUREMENT METHOD, RECORDING MEDIUM RECORDING SPECIFIC CONDUCTIVITY CALCULATION PROGRAM, AND SPECIFIC CONDUCTIVITY MEASUREMENT SYSTEM

(71) Applicant: FUJITSU LIMITED, Kawasaki (JP)

(72) Inventors: Kazuki Takahashi, Kawasaki (JP); Akiko Matsui, Meguro (JP); Kohei Choraku, Yokohama (JP); Mitsunori Abe, Kawasaki (JP); Tetsuro Yamada, Kawasaki (JP); Yoshio Kobayashi, Saitama (JP); Sotaro Kobayashi, Saitama (JP)

(73) Assignee: FUJITSU LIMITED, Kawasaki (JP)

( * ) Notice: Subject to any disclaimer, the term of this patent is extended or adjusted under 35 U.S.C. 154(b) by 301 days.

(21) Appl. No.: 16/850,054

(22) Filed: Apr. 16, 2020

(65) Prior Publication Data
US 2020/0341042 A1 Oct. 29, 2020

(30) Foreign Application Priority Data
Apr. 23, 2019 (JP) .............................. JP2019-082284

(51) Int. Cl.
*G01R 27/26* (2006.01)
(52) U.S. Cl.
CPC ............................... *G01R 27/2623* (2013.01)

(58) Field of Classification Search
CPC ............ G01R 27/2623; G01R 27/2641; G01R 27/2658
See application file for complete search history.

(56) References Cited

U.S. PATENT DOCUMENTS

| 4,667,172 A * | 5/1987 | Longshore ............ H01P 1/2138 333/263 |
| 10,359,372 B2 * | 7/2019 | Nyfors ...................... G01F 1/58 |

FOREIGN PATENT DOCUMENTS

| JP | 2001183311 | * | 6/2001 | ............ G01N 22/00 |
| JP | 2014-106224 A | | 6/2014 | |

* cited by examiner

*Primary Examiner* — Jeff W Natalini
(74) *Attorney, Agent, or Firm* — Fujitsu Patent Center

(57) ABSTRACT

A specific conductivity measurement method includes: performing first measurement to obtain a resonance frequency $f_1$ that is outputted to a measuring device when the first and second dielectric flat plates each have a thickness $t_1$, and an unloaded $Q_{u1}$ that corresponds to the resonance frequency $f_1$; performing second measurement to obtain a resonance frequency $f_2$ that is outputted to the measuring device when the first and second dielectric flat plates each have a thickness $t_2$ that is different from the thickness $t_1$, and an unloaded $Q_{u2}$ that corresponds to the resonance frequency $f_2$; and calculating a specific conductivity $\sigma_r$ of the copper foil and the first and second conductor flat plates based on an arithmetic equation that includes the resonance frequency the unloaded $Q_{u1}$, the resonance frequency $f_2$, and the unloaded $Q_{u2}$.

5 Claims, 9 Drawing Sheets

SPECIFIC CONDUCTIVITY MEASUREMENT METHOD, RECORDING MEDIUM RECORDING SPECIFIC CONDUCTIVITY CALCULATION PROGRAM, AND SPECIFIC CONDUCTIVITY MEASUREMENT SYSTEM

CROSS-REFERENCE TO RELATED APPLICATION

This application is based upon and claims the benefit of priority of the prior Japanese Patent Application No. 2019-82284, filed on Apr. 23, 2019, the entire contents of which are incorporated herein by reference.

FIELD

The embodiments discussed herein are related to a specific conductivity measurement method, a recording medium that stores therein a specific conductivity calculation program, and a specific conductivity measurement system.

BACKGROUND

Recently, there has been a demand for speed-up of communications by information and communication technology (ICT) devices.

Related art is disclosed in Japanese Laid-open Patent Publication No. 2014-106224 discloses

SUMMARY

According to an aspect of the embodiments, a specific conductivity measurement method includes: performing, by a computer, first measurement to obtain a resonance frequency f1 that is outputted to a measuring device when the first and second dielectric flat plates each have a thickness t1, and an unloaded Qu1 that corresponds to the resonance frequency f1, the measuring device coupled to a resonator that includes a circular copper foil, first and second dielectric flat plates that are disposed on both surface sides of the copper foil to sandwich the copper foil, first and second conductor flat plates that each have a hole at a center part and that sandwich the first and second dielectric flat plates from both sides with the centers of the first and second conductor flat plates aligned with the centers of the first and second dielectric flat plates, and excitation wires that are disposed in the respective holes of the first and second conductor flat plates; performing second measurement to obtain a resonance frequency f2 that is outputted to the measuring device when the first and second dielectric flat plates each have a thickness t2 that is different from the thickness t1, and an unloaded Qu2 that corresponds to the resonance frequency f2; and calculating a specific conductivity σr of the copper foil and the first and second conductor flat plates based on an arithmetic equation that includes the resonance frequency f1, the unloaded Qu1, the resonance frequency f2, and the unloaded Qu2.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

Figure 1:
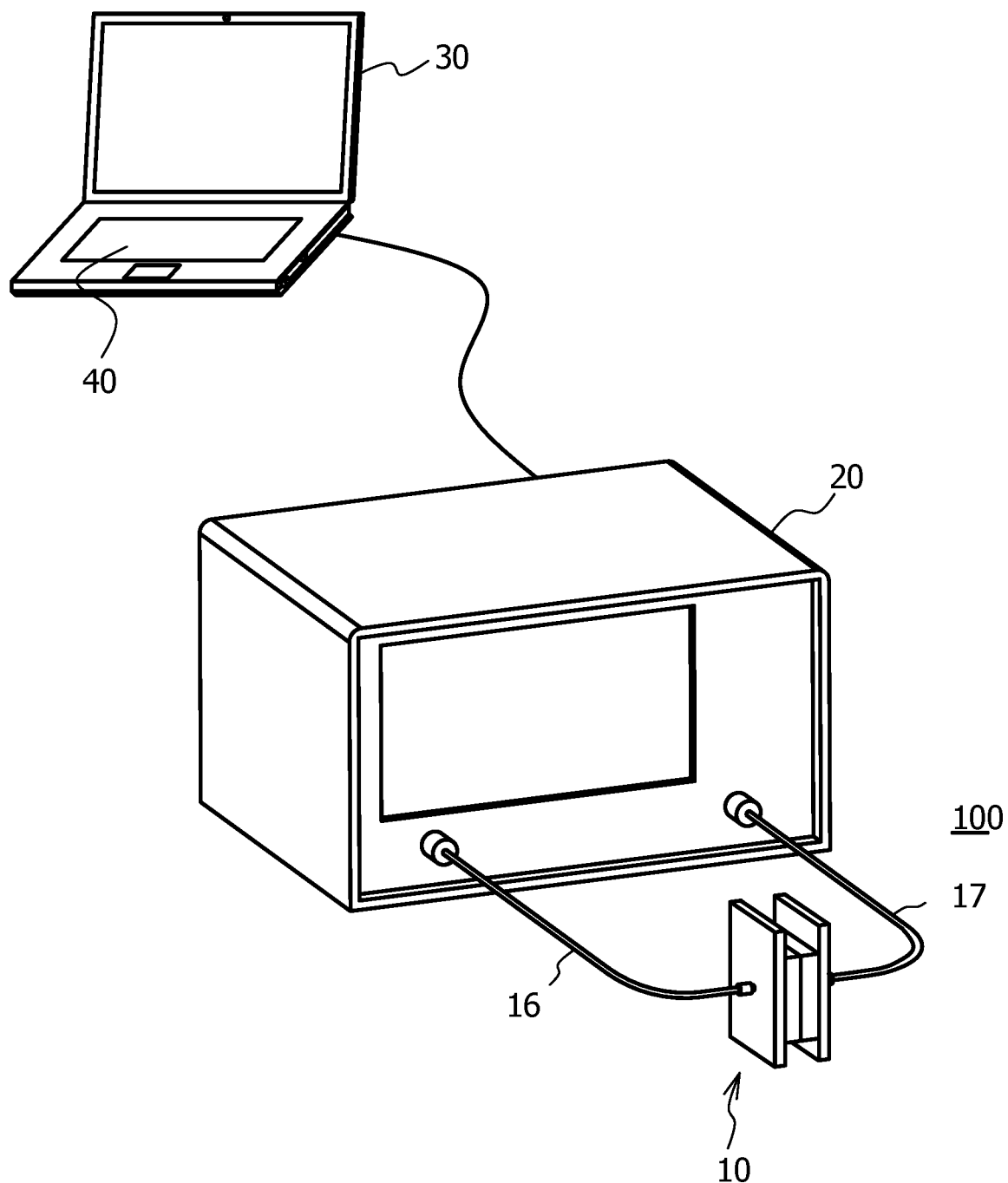
FIG. 1 is an explanatory diagram illustrating a schematic configuration of a specific conductivity measurement system in a first embodiment.

In a demand for speed-up of communications by information and communication technology (ICT) devices, there has been advanced reduction in the transmission loss of substrates themselves for use in printed circuit boards used in ICT devices, for example, reduction in the dissipation factor tan δ. Under such circumstances, it is desired to accurately measure dielectric properties such as a relative permittivity εr and a dissipation factor tan δ of a material to form a substrate. As an instrument of measuring such dielectric properties, for example, a circular disk resonator which performs measurement in a state where a circular disk resonance sheet (copper foil) and a sample (substrate) are sandwiched between a pair of metal plates (conductor flat plates) may be provided, Currently, the measurement of the relative permittivity εr and the dissipation factor tan δ of a material by such a circular disk resonator is often performed in a frequency band such as about 1 GHz, but the measurement method using a circular disk resonator may per se cope with expansion of a frequency range to be measured and reduction in the dissipation factor of materials.

In order to obtain the dissipation factor tan δ using a circular disk resonator, the specific conductivity $σ_r$ of the conductor flat plates and the copper foil has to be used as a known value. Thus, the obtaining the dissipation factor tan δ by using the circular disk resonator involves measuring this specific conductivity $σ_r$ in advance. Even though this specific conductivity $σ_r$ has frequency dependency, a method of measuring the specific conductivity $σ_r$ in a high frequency range (for example, a frequency range exceeding 20 GHz) has not been established yet so far. This results are in an inaccurate measured value of the dissipation factor tan δ using the circular disk resonator in a high frequency range in which the specific conductivity $σ_r$ is unmeasurable.

In one aspect, a specific conductivity $σ_r$ of a conductor in a wide frequency range may be measured.

Hereinafter, the embodiments of the present disclosure will be described with reference to the drawings. In the drawings, the dimensions, ratios, and others of some parts are not illustrated to be completely consistent with the actual ones in some cases. Also in some drawings, for convenience of description, some elements actually present are omitted or some elements are drawn with dimensions enlarged as compared to the actual ones in some cases.

First Embodiment

First, with reference to FIGS. 1 to 4, description will be given of an outline of a configuration of a specific conductivity measurement system (hereinafter referred to simply as a "measurement system") used in a specific conductivity measurement method in a first embodiment. Referring to FIG. 1, a measurement system 100 includes a resonator 10, a measuring device 20, and a processing device 30.

Figure 2:
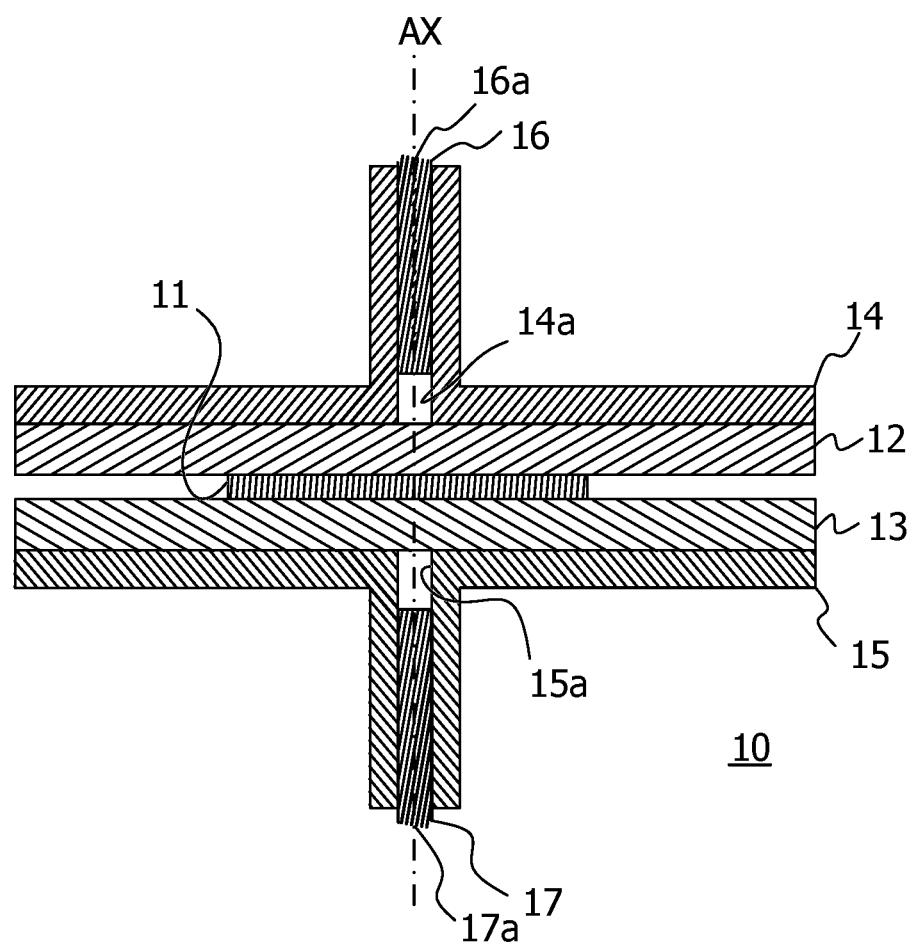
FIG. 2 is a cross-sectional view chematically illustrating a resonator according to the first embodiment.

Referring to FIG. 2, the resonator 10 is a so-called circular disk resonator. The resonator 10 includes a circular copper foil 11 and first and second dielectric flat plates 12 and 13 which are disposed on both surface sides of the copper foil 11 and sandwich the copper foil 11. The first and second dielectric flat plates 12 and 13 are a measurement target of a complex permittivity (a relative permittivity $\varepsilon_r$ and a dissipation factor tan $\delta$), and will be used, for example, as a material for a substrate The resonator 10 includes first and second conductor flat plates 14 and 15 which are both made of pure copper. The first conductor flat plate 14 has a hole 14a at a center part. The second conductor flat plate 15 has a hole 15a at a center part. The first and second conductor flat plates 14 and 15 are installed to have their centers aligned with the centers AX of the first and second dielectric flat plates 12 and 13 and to sandwich the first and second dielectric flat plates 12 and 13 from both sides.

The resonator 10 includes an excitation wire 16a disposed in the hole 14a of the first conductor flat plate 14. The excitation wire 16a is disposed in a cable 16. The resonator 10 includes an excitation wire 17a disposed in the hole 15a of the second conductor flat plate 15. The excitation wire 17a is disposed in a cable 17. The cable 16 and the cable 17 are both coupled to the measuring device 20.

In this embodiment, the specific conductivity $\sigma_r$ of the copper foil 11 and the first and second conductor flat plates 14 and 15 is obtained. The specific conductivity $\sigma_r$ mentioned herein is an average value of the specific conductivities of surface portions of the copper foil 11 and the first and second conductor flat plates 14 and 15, which are illustrated by thick lines in FIG. 2, with respect to $\sigma_0$. Here, $\sigma_0$ is the conductivity of the International Annealed copper Standard, and is $58\times10^6$ S/m.

The measuring device 20 is a network analyzer and is able to output a desired frequency and measure the complex permittivity (the relative permittivity $\varepsilon_r$ and the dissipation factor tan $\delta$) of the first and second dielectric flat plates 12 and 13 set in the resonator based on an output result from them.

Figure 3:
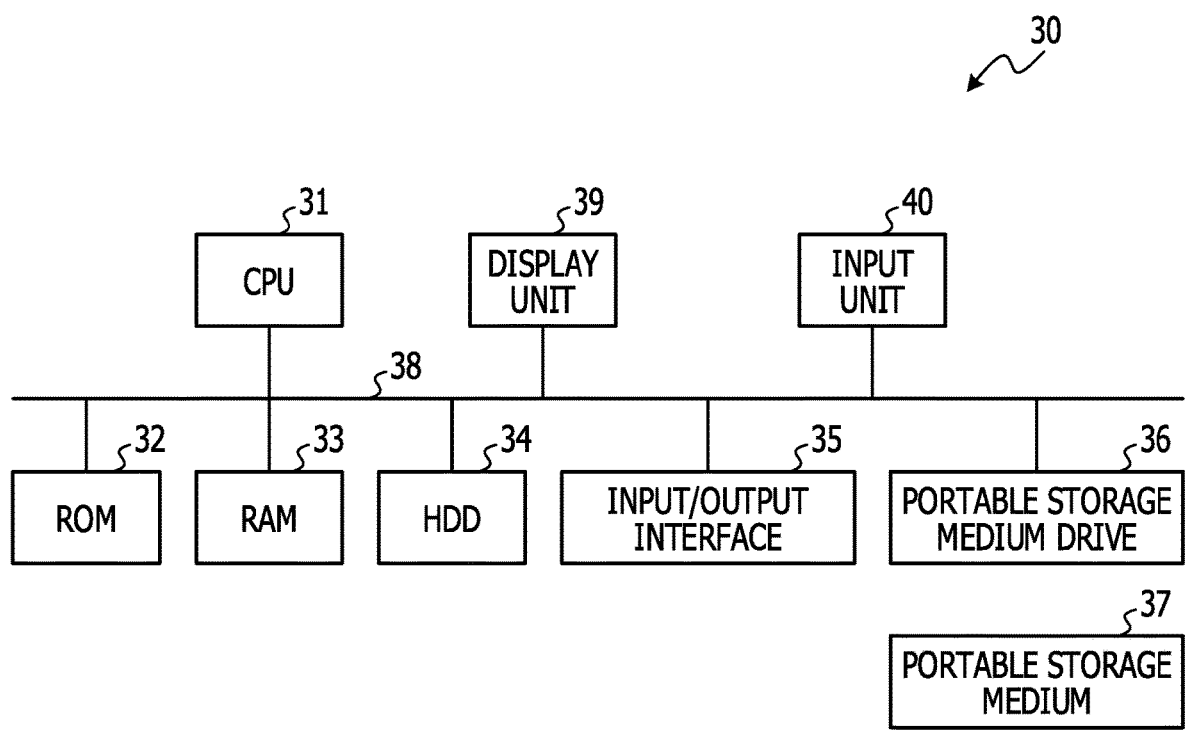
FIG. 3 is an explanatory diagram illustrating a schematic configuration of a hardware configuration of a processing device.

The processing device 30 is electrically coupled to the measuring device 20. Referring to FIG. 3, the processing device 30 includes a central processing unit (CPU) 31, a read-only memory (ROM) 32, a random-access memory (RAM) 33, a storage unit (a hard disk drive (HDD) in this example) 34, an input/output interface 35, a portable storage medium drive 36, a display unit 39, an input unit 40, and so on. These components of the processing device 30 are coupled to a bus 38. The display unit 39 includes a liquid crystal display or the like, and the input unit 40 includes a keyboard, a mouse, an input button, and so on. In the processing device 30, the CPU 31 executes a program (including a calculation program) stored in the ROM 32 or the HDD 34, or the program (including the calculation program) read from a portable storage medium 37 by the portable storage medium drive 36, whereby the functions of units in the processing device 30 included in the measurement system 100 illustrated in FIG. 4 are implemented.

Figure 4:
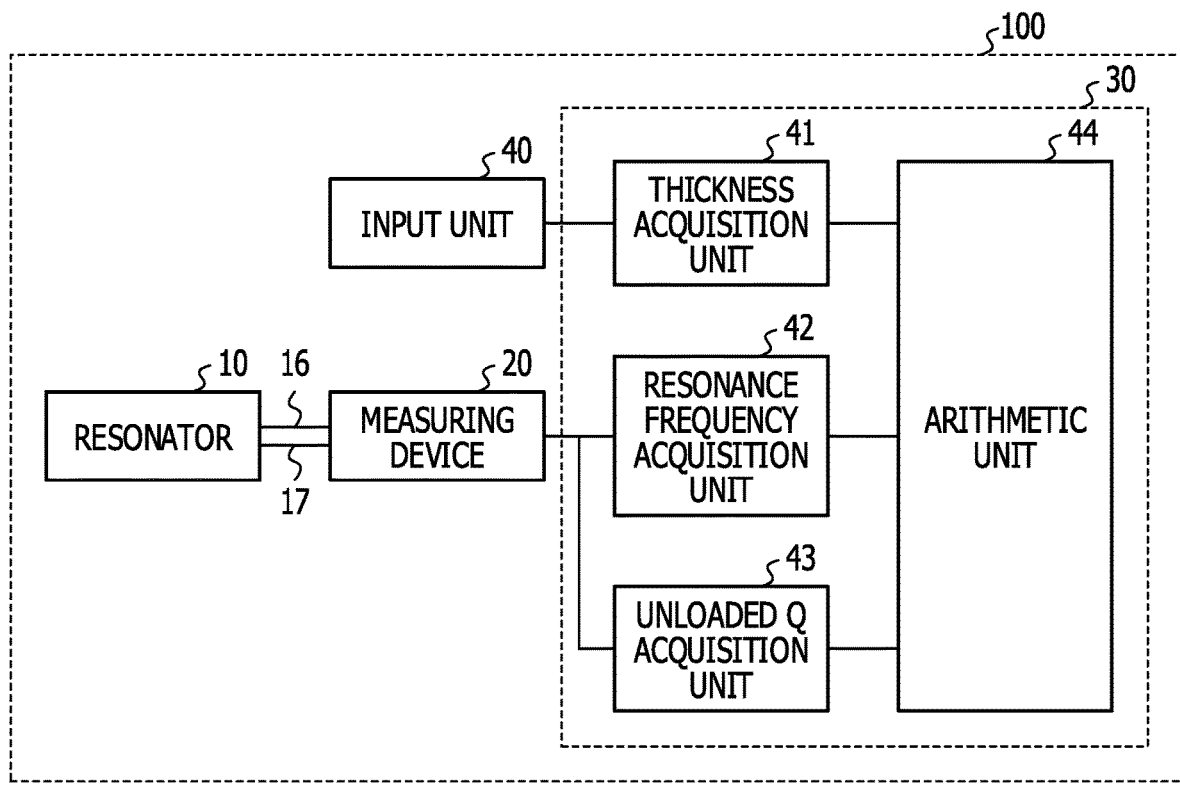
FIG. 4 is a functional block diagram of the processing device included in the specific conductivity measurement system in the first embodiment.

FIG. 4 is a functional block diagram of the processing device included in the specific conductivity measurement system in the first embodiment, The processing device 30 functions as a thickness acquisition unit 41, a resonance frequency acquisition unit 42, an unloaded Q acquisition unit 43, and an arithmetic unit 44, by executing a program by the CPU 31. The thickness acquisition unit 41 acquires the value of a thickness of the first and second dielectric flat plates 12 and 13 which is inputted through the input unit 40.

Next, the method of measuring the specific conductivity $\sigma_r$ in the present embodiment will be described. This measurement method is performed by executing a specific conductivity calculation program by using the measurement system 100 in the embodiment.

Prior to description of the details of the measurement method, an outline of the measurement method will be described. In the present embodiment, the specific conductivity $\sigma_r$ is determined based on Equation (1).

$$\sigma_r(f_0) = \frac{1}{\pi\mu_0\sigma_0} \frac{1}{f_0}\left[\frac{t_{f2} - t_{f1}}{t_{f1}t_{f2}} \frac{Q_{u1}Q_{u2}}{Q_{u2} - Q_{u1}}\right]^2, \quad (1)$$

where, $$f_0 = \frac{f_1 + f_2}{2}, \; t_{f1} = \sqrt{\frac{f_1}{f_0}}\, t_1 \; t_{f2} = \sqrt{\frac{f_2}{f_0}}\, t_2.$$

Equation (1) is obtained by substituting an output value of the measuring device 20 into Equations (4) and (5) which represent the dissipation factors tan $\delta$ respectively for different thicknesses of the first and second dielectric flat plates 12 and 13, and each of which is derived by substituting Equation (3) into Equation (2):

$$\tan\delta = \left(\frac{1}{Q_u} - \frac{1}{Q_c}\right); \quad (2)$$

$$Q_c = \frac{t}{\delta_s} = t\sqrt{\pi f_{0m0}\mu_0\sigma}; \quad (3)$$

$$\tan\delta = \frac{1}{Q_{u1}} - \frac{1}{t_1}\sqrt{\frac{1}{\pi f_1\mu_0\sigma}}; \quad (4)$$

and $$\tan\delta = \frac{1}{Q_{u2}} - \frac{1}{t_2}\sqrt{\frac{1}{\pi f_2\mu_0\sigma}}. \quad (5)$$

When excitation is caused by using the resonator 10 through the excitation wires 17a and 16a, only a $TM_{0m0}$ mode is excited. Thus, the relative permittivity $\varepsilon_r$ and the dissipation factor tan $\delta$ in a direction perpendicular to the first and second dielectric flat plates 12 and 13 are obtained from measured values of the resonance frequency $f_{0m0}$ and an unloaded Q: $Q_u$ in each $TM_{0m0}$ mode, The resonance frequency is the value of the frequency at the resonance peak, and the unloaded Q is obtained by using the value of an insertion loss at the peak and the value of a loaded Q obtained from the width of the resonance frequency at a point lower than the resonance peak by a fixed value (for example, 3 dB). Since the resonance frequency increases as the order m becomes higher, it is possible to measure the complex permittivity in each of a plurality of frequency bands by one measurement.

Here, tan δ is obtained by subtracting the influence of a conductor loss from the unloaded Q: $Q_u$ in the $TM_{0m0}$ mode, and therefore, it is usually possible to express tan δ by Equation (2). In Equation (2), $Q_c$ represents the Q value of a conductor loss of the copper foil 11 and the first and second conductor flat plates 14 and 15, which are a conductor included in the resonator 10, and is given by Equation (3). In Equation (3), $\delta_s$ represents the thickness of each of the first and second dielectric flat plates 12 and 13, $\delta_s$ represents the skin depth of the conductor, and $\mu_0$ (=4n×10$^{-7}$ H/m) represents the magnetic permeability in vacuum. In addition, $\sigma=\sigma_0\sigma_r$ represents a conductivity, where $\sigma_0$ (=58×10$^6$ S/m) represents the conductivity of the International Annealed topper Standard as mentioned above, and $\sigma_r$ represents an average value of the specific conductivities of the surface portions of the copper foil 11 and the first and second conductor flat plates 14 and 15, which are illustrated by the thick lines in FIG. 2, with respect to $\sigma_0$. As the frequency becomes higher, the current is usually concentrated near the surface of the conductor within a thickness of about $\delta_s$ by the skin effect. Therefore, the effective value of the specific conductivity $\sigma_r$ is lower than that of a concerned conductor due to the influence of the surface roughness or the like of the conductor surface, and has frequency dependency.

Figure 5A:
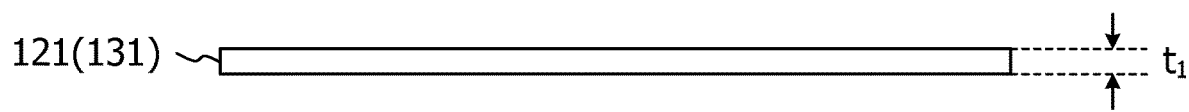
FIG. 5A is a side view of a dielectric flat plate having a thickness $t_1$.
Figure 5B:
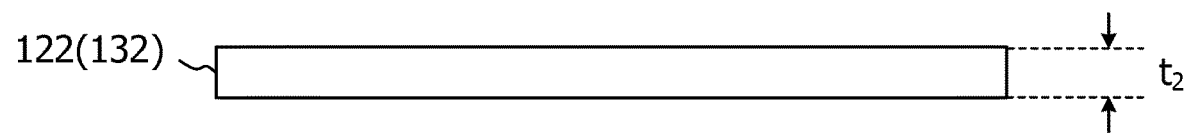
FIG. 5B is a side view of a dielectric flat plate having a thickness $t_2$.

The present embodiment uses a measurement result obtained in the cases where a first dielectric flat plate 121 and a second dielectric flat plate 131 have a thickness $t_1$ as illustrated in FIG. 5A, and where a first dielectric flat plate 122 and a second dielectric flat plate 132 have a thickness $t_2$ as illustrated in FIG. 5B, For instance, Equation (4) representing tan δ is obtained by substituting, into Equations (2) and (3), the resonance frequency $f_1$ obtained when the first and second dielectric flat plates 121 and 131 have the thickness $t_1$, and the unloaded $Q_{u1}$ corresponding to the resonance frequency $f_1$. Similarly, Equation (5) representing tan δ is obtained by substituting, into Equations (2) and (3), the resonance frequency $f_2$ obtained when the first and second dielectric flat plates 122 and 132 have the thickness $t_2$, and the unloaded $Q_{u2}$ corresponding to the resonance frequency $f_2$. Both of tan δ represented by Equation (4) and tan δ represented by Equation (5) are tan δ of the first dielectric flat plate 12 (121 and 122) and the second dielectric flat plate 13 (131 and 132) which are made of the same material. The dissipation factor tan δ does not depend on the thickness. For these reasons, both of the above two dissipation factors have the same value, Therefore, Equation (1) is obtained by combining Equation (4) and Equation (5).

Figure 6:
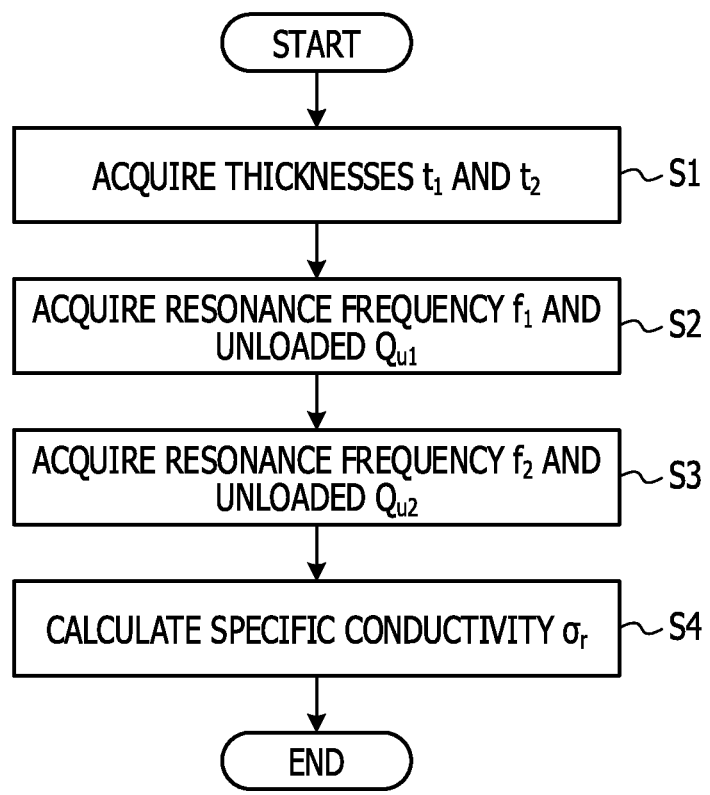
FIG. 6 is an example of a flowchart illustrating a specific conductivity measurement method in the first embodiment.
Figure 7A:
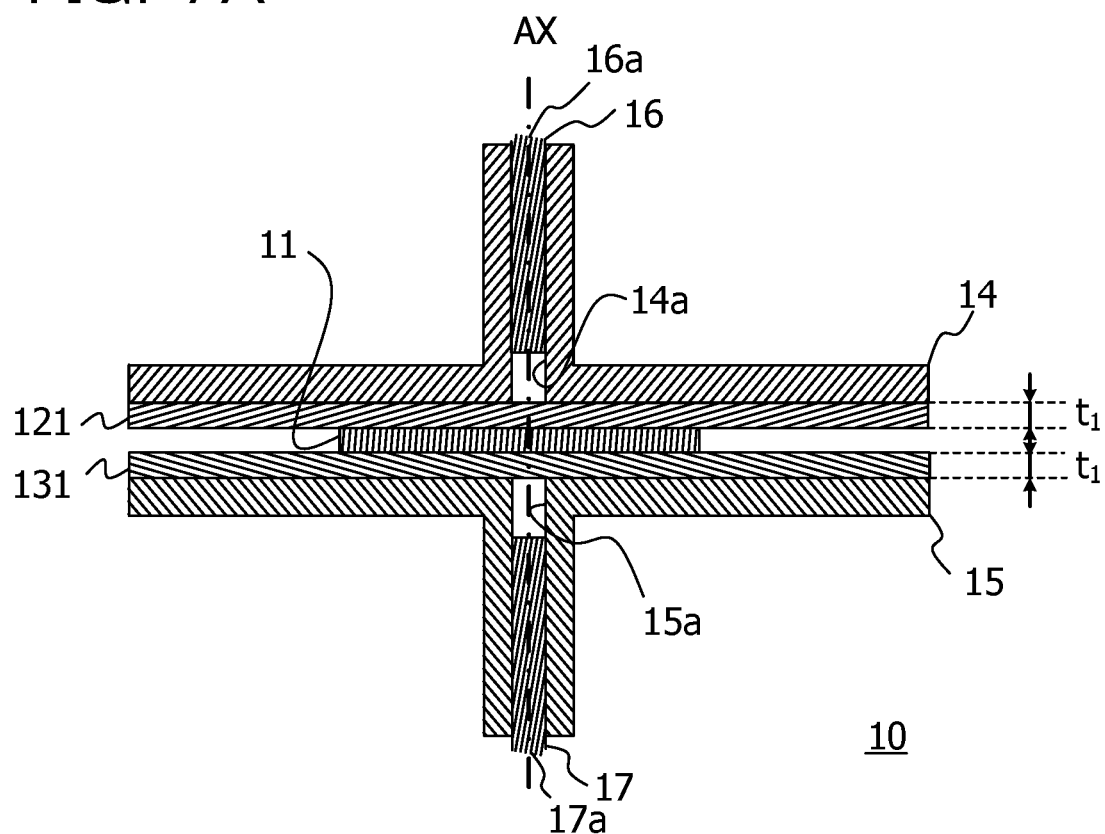
FIG. 7A is a cross-sectional view schematically illustrating a resonator in which dielectric flat plates having a thickness $t_1$ are installed.
Figure 7B:
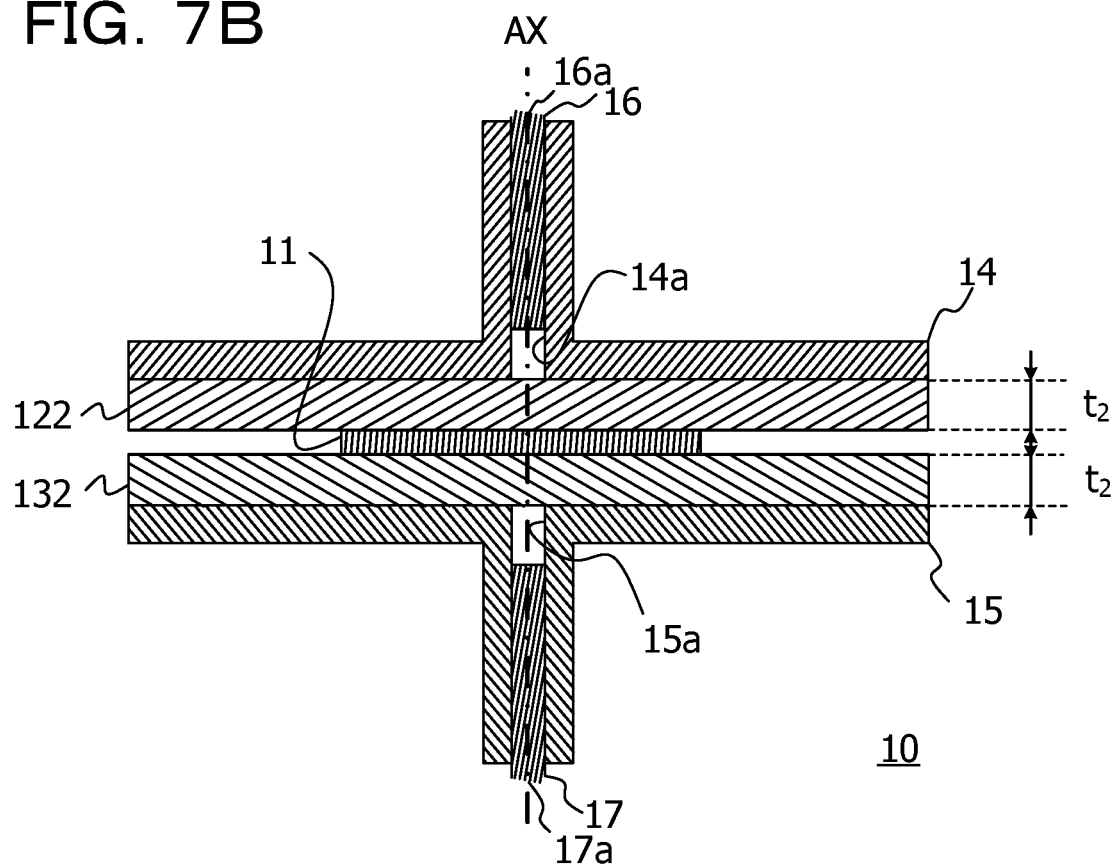
FIG. 7B is a cross-sectional view schematically illustrating the resonator in which dielectric flat plates having a thickness $t_2$ are installed.
Figure 8:
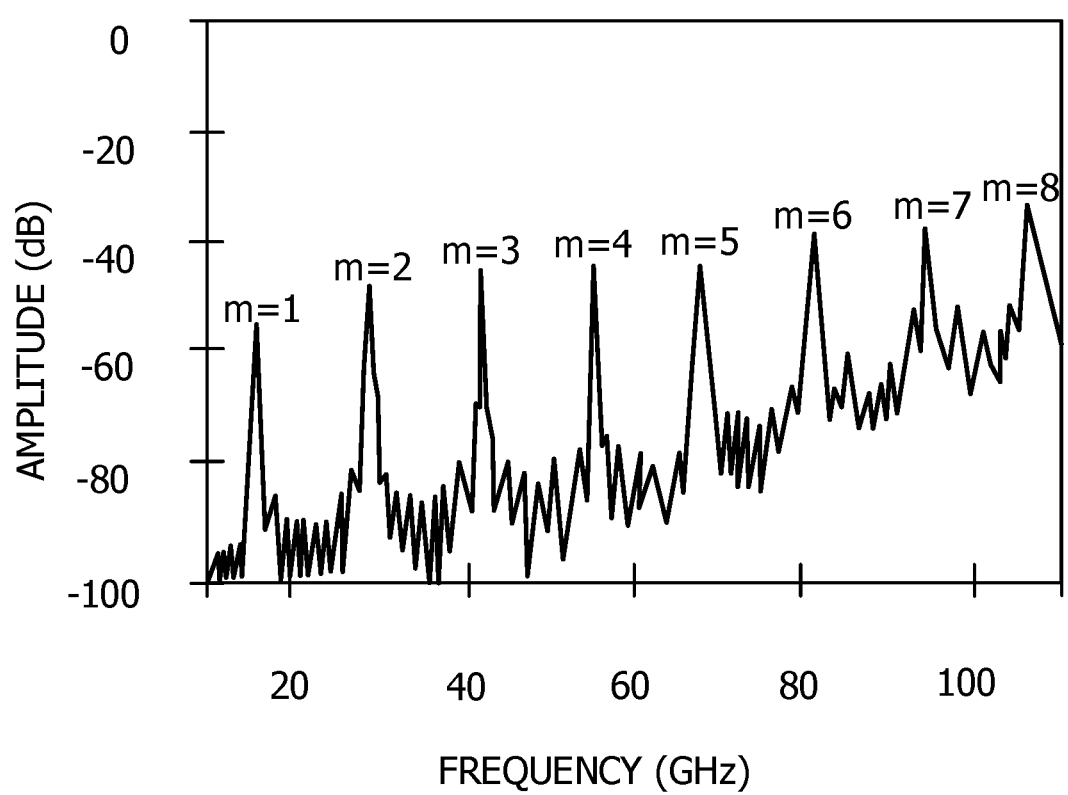
FIG. 8 is a graph illustrating an example of a measurement result of a measuring device in the first embodiment.

Next, an example of the method of measuring the specific conductivity $\sigma_r$ will be described with reference to FIGS. 6 to 8. Two sets of first dielectric flat plates 12 and second dielectric flat plates 13 having different thicknesses are prepared. For instance, a set of a first dielectric flat plate 121 and a second dielectric flat plate 131 each having a thickness $t_1$ and a set of a first dielectric flat plate 122 and a second dielectric flat plate 132 each having a thickness $t_2$ are prepared. The thicknesses $t_1$ and $t_2$ are inputted to the thickness acquisition unit 41 through the input unit 40 in step S1. As a result, the thickness acquisition unit 41 acquires the thickness $t_1$ and the thickness $t_2$. When the values of the thickness $t_1$ and the thickness $t_2$ are already inputted or stored, the thickness acquisition unit 41 may acquire the thickness $t_1$ and the thickness $t_2$ by reading these values.

In step S2 subsequent to step S1, the resonance frequency acquisition unit 42 acquires the resonance frequency $f_1$, and the unloaded Q acquisition unit 43 acquires the unloaded $Q_{u1}$. The resonance frequency $f_1$ and the unloaded $Q_{u1}$ are obtained through measurement in a state where the first dielectric flat plate 121 and the second dielectric flat plate 131 each having the thickness $t_1$ are set in the resonator 10 as illustrated in FIG. 7A. FIG. 8 illustrates an example of a measurement result in the case where the resonance waveform in each $TM_{0m0}$ mode is observed while the order m is sequentially changed. The resonance frequency $f_1$ and the unloaded $Q_{u1}$ are obtained from the aforementioned measurement result.

In step S3, the resonance frequency acquisition unit 42 acquires the resonance frequency $f_2$, and the unloaded Q acquisition unit 43 acquires the unloaded $Q_{u2}$. The resonance frequency $f_2$ and the unloaded $Q_{u2}$ are obtained through measurement in a state where the first dielectric flat plate 122 and the second dielectric flat plate 132 each having the thickness $t_2$ are set in the resonator 10 as illustrated in FIG. 7B. Also in this case, the resonance frequency $f_2$ and the unloaded $Q_{u2}$ are obtained in the manner same as or similar to that in step S2. Steps S2 and S3 may be performed in the reverse order.

In step S4 subsequent to step S3, the arithmetic unit 44 calculates a specific conductivity $\sigma_r$. The specific conductivity $\sigma_r$ is calculated by substituting the thickness $t_1$, the resonance frequency $f_1$, the unloaded $Q_{u1}$, the thickness $t_2$, the resonance frequency $f_2$, and the unloaded $Q_{u2}$ into Equation (1).

In the present embodiment, the thicknesses are set as $t_2 > t_1$. A correction amount ΔR for an edge effect usually becomes larger as the thickness of the dielectric flat plate becomes larger, so that $\Delta R_1 < \Delta R_2$ holds. The resonance frequency $f_1$ corresponding to $t_1$ becomes slightly higher than the resonance frequency $f_2$ corresponding to $t_2$. Since the energy accumulated in the dielectric is directly proportional to the thickness t, the unloaded $Qu_1$ corresponding to the thickness $t_1$ is lower than the unloaded $Qu_2$ corresponding to the thickness $t_2$. On the other hand, the first conductor flat plate 14 and the second conductor flat plate 15 are common to the two thicknesses and allow equal electric currents to flow over the conductors, so that the specific conductivities or corresponding to the two thicknesses are equal to each other. The dissipation factor tan δ of the first dielectric flat plate 121 (122) and the second dielectric flat plate 131 (132) does not depend on the thickness t, and is equal for the two thicknesses.

This makes it possible to measure the specific conductivity $\sigma_r$ of a conductor in a wide frequency range up to a high frequency range exceeding, for example, 20 HZm, or an even higher frequencyfregquency range such for example as 110 HZm.

The value of $\sigma_r$ obtained in this way is substituted back into, for example, Equation (2) to perform calculation obtaining the value of tan δ.

Second Embodiment

Figure 9:
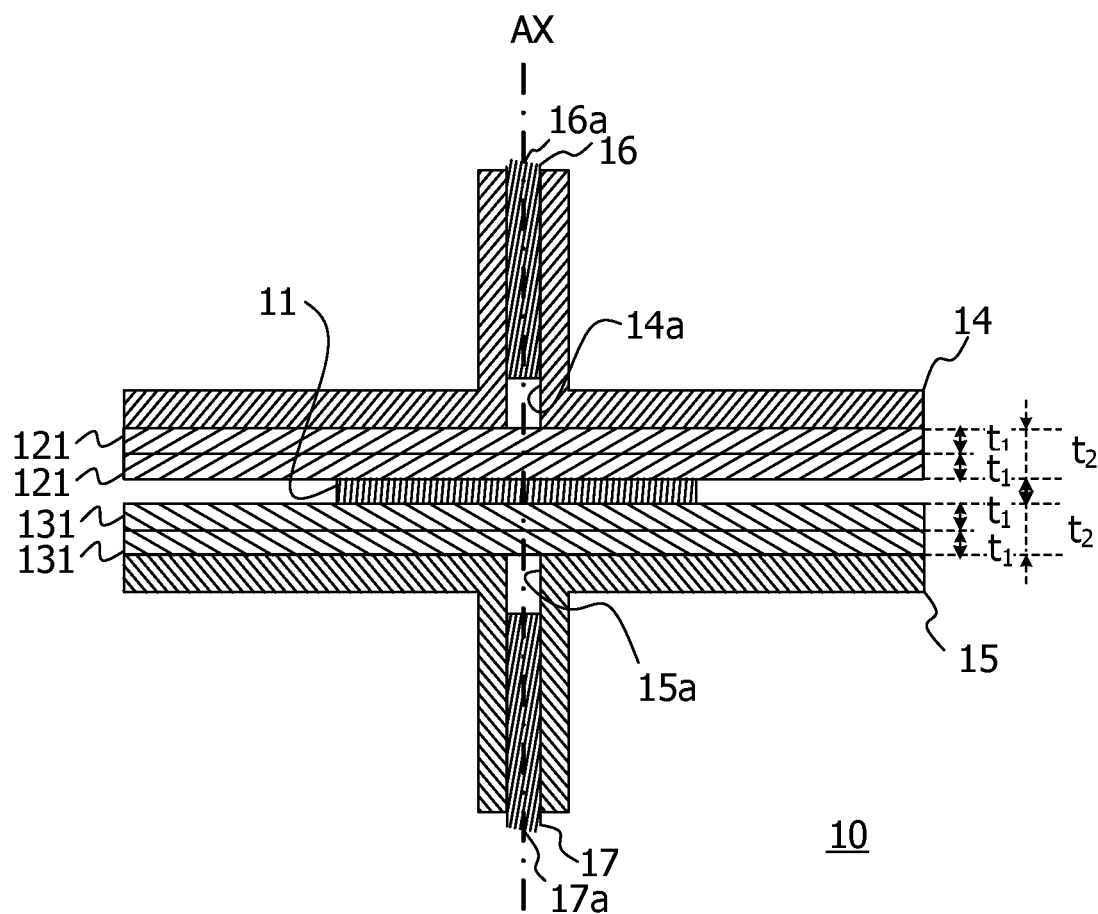
FIG. 9 is a cross-sectional view schematically illustrating a resonator in a second embodiment.

Next, referring to FIG. 9, a second embodiment will be described. In the first embodiment, the first dielectric flat plate 121 and the second dielectric flat plate 131 have the thickness $t_1$ while the first dielectric flat plate 122 and the second dielectric flat plate 132 have the thickness $t_2$. In the present embodiment, in step S3 for obtaining the resonance frequency $f_2$ and the unloaded $Q_{u2}$, the first dielectric flat plates 121 each having a thickness $t_1$ are stacked up to have a thickness $t_2$, and the second dielectric flat plates 131 each having the thickness $t_1$ are stacked up to have the thickness $t_2$.

In the course of stacking up the two first dielectric flat plates 121 and stacking up the two second dielectric flat plates 131, the following treatments are applied such that no gap may be formed between the mating surfaces. For example, foreign matters such as dust on the surfaces of the dielectric flat plates are removed by air to reduce the generation of gaps with the foreign matters sandwiched between the surfaces. A static eliminator is applied to the surfaces of the dielectric flat plates to remove adhesion of foreign matters due to static electricity. When dielectric flat plates warp, the dielectric flat plates are stacked up in such a way that their surfaces convex in the center are set inside and brought into contact with each other, so that no gap may be formed at the center part. Another effective treatment is to remove a gap by applying an air remover in a state where the two first dielectric flat plates 121 and the two second dielectric flat plates 131 set in the resonator 10.

By substituting the resonance frequency $f_2$ and the unloaded $Q_{u2}$ obtained in this manner into Equation (1), it is possible to measure the specific conductivity $\sigma_r$ of the conductor in a wide frequency range in the manner same as or similar to that in the first embodiment.

Although the preferred embodiments according to the present disclosure have been described in detail above, the present disclosure is not limited to the specific embodiments, and various modifications and changes may be made within the scope of the gist of the present disclosure described in the claims.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A specific conductivity measurement method comprising:
obtaining, by a computer, a resonance frequency $f_1$ that is acquired by a measuring device coupled to a resonator, which includes a circular copper foil, first and second dielectric flat plates that are disposed on both surface sides of the copper foil to sandwich the copper foil, first and second conductor flat plates that each have a hole at a center part and that sandwich the first and second dielectric flat plates from both sides with the centers of the first and second conductor flat plates aligned with the centers of the first and second dielectric flat plates, and excitation wires that are disposed in the respective holes of the first and second conductor flat plates, based on the first and second dielectric flat plates that each has a thickness $t_1$, and an unloaded $Q_{u1}$ that corresponds to the resonance frequency $f_1$;
obtaining a resonance frequency $f_2$ that is acquired by the measuring device based on the first and second dielectric flat plates that each has a thickness $t_2$ that is different from the thickness $t_1$, and an unloaded $Q_{u2}$ that corresponds to the resonance frequency $f_2$; and
calculating a specific conductivity $\sigma_r$ of the copper foil and the first and second conductor flat plates based on an arithmetic equation that includes the resonance frequency $f_1$, the unloaded $Q_{u1}$, the resonance frequency $f_2$, and the unloaded $Q_{u2}$.

2. The specific conductivity measurement method according to claim 1, wherein
the calculating includes calculating the specific conductivity $\sigma_r$ based on Equation (1):

$$\sigma_r(f_0) = \frac{1}{\pi\mu_0\sigma_0} \frac{1}{f_0} \left[ \frac{t_{f2} - t_{f1}}{t_{f1}t_{f2}} \frac{Q_{u1}Q_{u2}}{Q_{u2} - Q_{u1}} \right]^2, \quad (1)$$

where, $$f_0 = \frac{f_1 + f_2}{2}, t_{f1} = \sqrt{\frac{f_1}{f_0}} \, t_1 \; t_{f2} = \sqrt{\frac{f_2}{f_0}} \, t_2,$$

where $\mu_0$ represents a magnetic permeability in vacuum and corresponds to $4\pi \times 10^{-7}$ H/m and $\sigma_0$ represents a conductivity of International Annealed Copper Standard and corresponds to $58 \times 10^6$ S/m.

3. The specific conductivity measurement method according to claim 1, wherein
the thickness $t_2$ is two times larger than the thickness $t_1$, and
the first dielectric flat plate and the second dielectric flat plate are formed to have the thickness $t_2$ by stacking up the first dielectric flat plates and stacking up the second dielectric flat plates, respectively, which each have the thickness $t_1$.

4. A non-transitory recording medium that stores therein a specific conductivity calculation program which causes the computer to execute processing comprising:
obtaining a resonance frequency $f_1$ that is acquired by a measuring device coupled to a resonator, which includes a circular copper foil, first and second dielectric flat plates that are disposed on both surface sides of the copper foil to sandwich the copper foil, first and second conductor flat plates that each have a hole at a center part and that sandwich the first and second dielectric flat plates from both sides with the centers of the first and second conductor flat plates aligned with the centers of the first and second dielectric flat plates, and excitation wires that are disposed in the respective holes of the first and second conductor flat plates, based on the first and second dielectric flat plates that each has a thickness $t_1$, and an unloaded $Q_{u1}$ that corresponds to the resonance frequency $f_1$;
obtaining a resonance frequency $f_2$ that is acquired by the measuring device based on the first and second dielectric flat plates that each has a thickness $t_2$ that is different from the thickness $t_1$, and an unloaded $Q_{u2}$ that corresponds to the resonance frequency $f_2$; and
calculating a specific conductivity $\sigma_r$ of the copper foil and the first and second conductor flat plates based on an arithmetic equation that includes the resonance frequency $f_1$, the unloaded $Q_{u1}$, the resonance frequency $f_2$, and the unloaded $Q_{u2}$.

5. A specific conductivity measurement system comprising:
a measuring device coupled to a resonator that includes a circular copper foil, first and second dielectric flat plates that are disposed on both surface sides of the copper foil to sandwich the copper foil, first and second conductor flat plates that each have a hole at a center part and that sandwich the first and second dielectric flat plates from both sides with the centers of the first and second conductor flat plates aligned with the centers of the first and second dielectric flat plates, and excitation wires that are disposed in the respective holes of the first and second conductor flat plates; and a processor coupled to the measuring device and configured to:

acquire a value of a thickness of the first dielectric flat plate and the second dielectric flat plate;

acquire a resonance frequency acquired by the measuring device;

acquire a value of an unloaded Q acquired by the measuring device; and obtain a specific conductivity $\sigma_r$ of the copper foil and the first and second conductor flat plates based on an arithmetic equation which includes a resonance frequency $f_1$ that is acquired based on the first and second dielectric flat plates that each has a thickness $t_1$, an unloaded $Q_{u1}$ that corresponds to the resonance frequency $f_1$, a resonance frequency $f_2$ that is acquired based on the first and second dielectric flat plates that each has a thickness $t_2$ that is different from the thickness $t_1$, and an unloaded $Q_{u2}$ that corresponds to the resonance frequency $f_2$.

\* \* \* \* \*